US008456861B2

United States Patent
Sung et al.

(10) Patent No.: US 8,456,861 B2
(45) Date of Patent: Jun. 4, 2013

(54) DISPLAY MODULES AND METHODS OF FIXING FLEXIBLE CIRCUIT BOARDS THEREIN

(75) Inventors: Kuang-Tao Sung, Fongyuan (TW); Shih-Hsien Chen, Shengang Township, Taichung County (TW)

(73) Assignee: AU Optronics Corp., Hsinchu (TW)

( * ) Notice: Subject to any disclaimer, the term of this patent is extended or adjusted under 35 U.S.C. 154(b) by 117 days.

(21) Appl. No.: 13/209,165

(22) Filed: Aug. 12, 2011

(65) Prior Publication Data

US 2011/0296671 A1    Dec. 8, 2011

Related U.S. Application Data

(62) Division of application No. 10/914,385, filed on Aug. 9, 2004, now Pat. No. 8,023,284.

(30) Foreign Application Priority Data

May 20, 2004   (TW) ............................... 93114223 A

(51) Int. Cl.
*H05K 7/02* (2006.01)
*H05K 7/04* (2006.01)

(52) U.S. Cl.
USPC ............ 361/807; 361/749; 361/809; 361/810

(58) Field of Classification Search
USPC .. 361/749, 807, 809, 810, 681, 760; 174/254; 439/149, 151, 58, 61; 29/844, 861, 877, 882
See application file for complete search history.

(56) References Cited

U.S. PATENT DOCUMENTS

| 665,455 | A | | 1/1901 | Ting |
|---|---|---|---|---|
| 5,550,342 | A | | 8/1996 | Danek et al. |
| 5,739,880 | A | | 4/1998 | Suzuki et al. |
| 5,739,887 | A | | 4/1998 | Ueda et al. |
| 5,748,179 | A | | 5/1998 | Ito et al. |
| 5,838,400 | A | | 11/1998 | Ueda et al. |
| 5,838,412 | A | | 11/1998 | Ueda et al. |
| 5,897,188 | A | | 4/1999 | Sasuga et al. |
| 6,089,442 | A | * | 7/2000 | Ouchi et al. ............... 228/180.1 |
| 6,181,561 | B1 | | 1/2001 | Albrecht et al. |
| 6,411,359 | B1 | | 6/2002 | Kobayashi et al. |
| 6,507,484 | B2 | | 1/2003 | Fukuyoshi |
| 6,527,162 | B2 | * | 3/2003 | Totani et al. .................. 228/175 |
| 6,583,843 | B2 | | 6/2003 | Ishino |
| 6,657,697 | B2 | | 12/2003 | Yamate et al. |
| 6,762,807 | B2 | | 7/2004 | Lee et al. |
| 7,034,913 | B2 | | 4/2006 | Ishida |
| 7,113,237 | B2 | * | 9/2006 | Nitto et al. ...................... 349/58 |
| 7,182,500 | B2 | * | 2/2007 | Sugawara ..................... 362/634 |
| 7,606,035 | B2 | | 10/2009 | Park et al. |

(Continued)

FOREIGN PATENT DOCUMENTS

JP   2003195340   12/2001
TW      491489     6/2002

*Primary Examiner* — Hung S Bui
(74) *Attorney, Agent, or Firm* — McClure, Qualey & Rodack, LLP

(57) ABSTRACT

A method of fixing a flexible circuit board. The method comprises the following steps: providing a flexible circuit board having a locating hole, providing a display module frame having a locating element corresponding to the locating hole, passing the locating element through the locating hole, bonding the flexible circuit board to the frame and deforming the locating element for to fix the flexible circuit board on the frame.

7 Claims, 6 Drawing Sheets

U.S. PATENT DOCUMENTS

| | | |
|---|---|---|
| 2001/0003471 A1 | 6/2001 | Lee et al. |
| 2001/0010569 A1 | 8/2001 | Jin et al. |
| 2002/0018296 A1 | 2/2002 | Kashiwaba et al. |
| 2004/0080749 A1 | 4/2004 | Lutz et al. |
| 2004/0114144 A1 | 6/2004 | Lutz et al. |
| 2005/0041310 A1 | 2/2005 | Higashihara |
| 2007/0165152 A1 | 7/2007 | Suzuki et al. |

* cited by examiner

DISPLAY MODULES AND METHODS OF FIXING FLEXIBLE CIRCUIT BOARDS THEREIN

CROSS REFERENCE TO RELATED APPLICATIONS

This application is a divisional of U.S. application Ser. No. 10/914,385, filed Aug. 9, 2004, which claims the benefit of Taiwanese Application No. 93114223 filed May 20, 2004, entire contents of which are hereby incorporated by reference.

BACKGROUND

The present invention relates to flexible circuit boards.

In a liquid crystal display module, a flexible circuit board is used to support light emitting elements. As shown in FIG. 1, a conventional liquid crystal display 100 has a frame 20 supporting a Thin Film Transistor panel (TFT panel) 10. A flexible circuit board 30 supporting a light emitting diode 50 serving as a light source is disposed on the frame 20 with one end fixed on the top of the TFT panel 10. The flexible circuit board bends across a side wall of the frame 20 and the other end is fixed on the bottom of the frame 20 with a tape 40. The light emitting diode 50 is mounted on the flexible circuit board 30 by Surface Mounted Technology.

In such a structure, the flexible circuit board 30 is typically too rigid for the tape 40 to fix the board 30 on the TFT panel 10. This results in a problem for the light emitting diode 50 precisely locating in the display module and can reduce the performance of the display module. The drawbacks of such a structure can include: a longer assembly time because the flexible circuit board is not easily fixed for locating the light emitting diode 50 on a desired position; a lack of stable optic characteristics because the flexible circuit board is too rigid to bond on the frame smoothly; and a tendency of the flexible circuit board to shift due to rigidity thereof, particularly in a high temperature environment (heat from the light source) where the tape typically exhibits insufficient bonding ability. This also can cause unstable optic characteristics.

SUMMARY

An embodiment of a method comprises the following steps: providing a flexible circuit board having a locating hole; providing a locating element disposed on the frame corresponding to the locating hole; passing the locating element through the locating hole; bonding the flexible circuit board onto the frame; and deforming the locating element to fix the flexible circuit board on the frame.

An embodiment of a display module comprises a frame having a locating element and a flexible circuit board having a locating hole corresponding to the locating element, wherein the flexible circuit board is fixed on the frame by deforming the locating element to engage with the locating hole.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 4a-1 is a schematic view of another embodiment of a liquid crystal display (the locating element is deformed);

FIG. 4b-1 is a schematic view of another embodiment of a liquid crystal display (the locating element is deformed).

DETAILED DESCRIPTION

Referring to FIGS. 2a-2d, an embodiment of a liquid crystal display 200 is depicted that includes a frame 2000 and a flexible circuit board 3000. A locating element 5000 is disposed on the frame 2000. In this embodiment, the locating element 5000 is a column protruding from the frame 2000. The locating element 5000 can be made of plastic. The flexible circuit board 3000 incorporates a locating hole 3010 corresponding to the location element 5000.

Figure 2A:
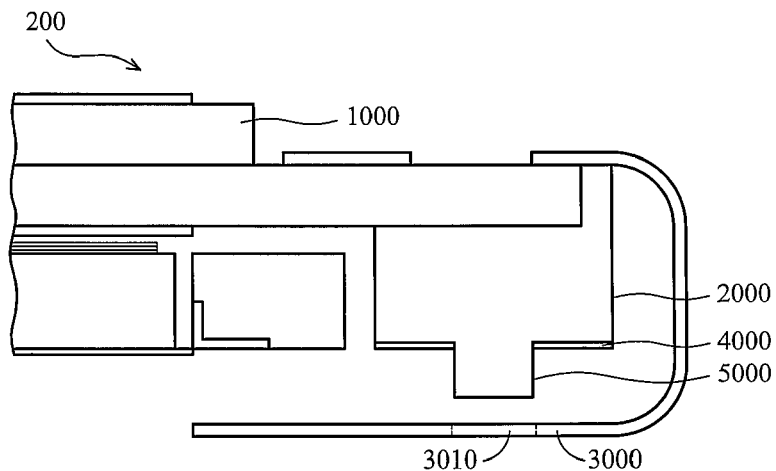
FIGS. 2a-2d show an embodiment of a method of fixing a flexible circuit board on a frame of a liquid crystal display module.
Figure 2B:
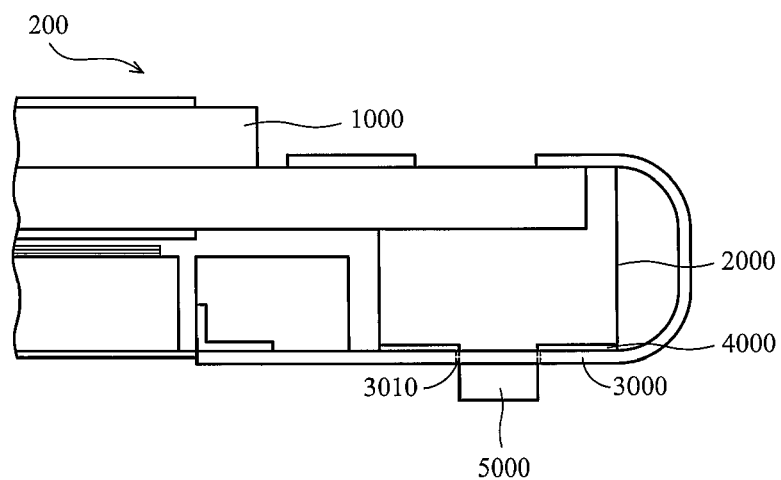
Figure 2C:
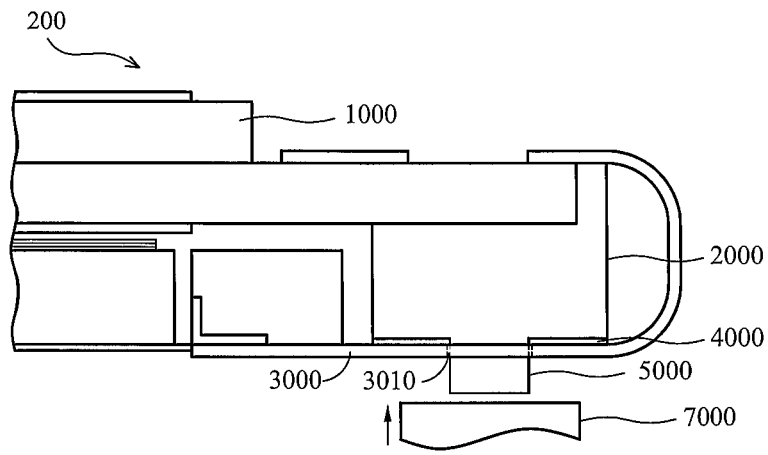
Figure 2D:
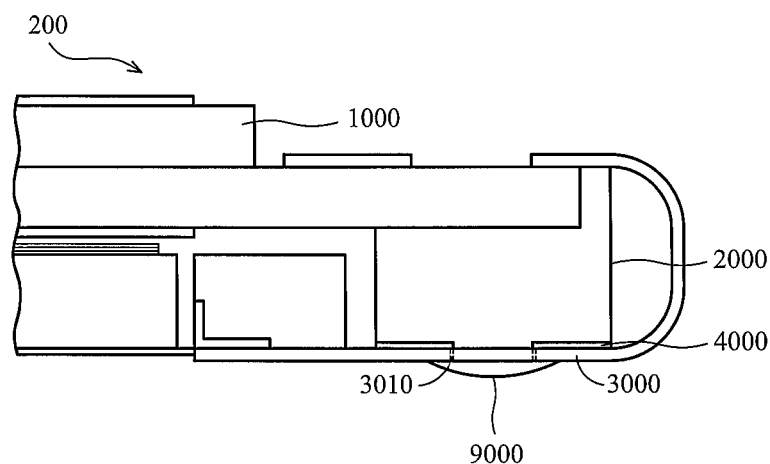

Fixing of the flexible circuit board 3000, as shown in FIGS. 2a-2d, comprises the following steps. As shown in FIG. 2a, the locating hole 3010 is aligned with the locating element 5000 of the frame 2000. As shown in FIG. 2b, the flexible circuit board 3000 is bonded to the frame 2000 by a tape 4000. As shown in FIG. 2c, the locating element 5000 is heated and pressed by a thermopress device 7000. Finally as shown in FIG. 2d, the locating element 5000 is deformed to become a deformed head 9000 which has a diameter larger than the locating hole 3010, thereby fixing the flexible circuit board 3000 on the frame 2000.

Figure 3:
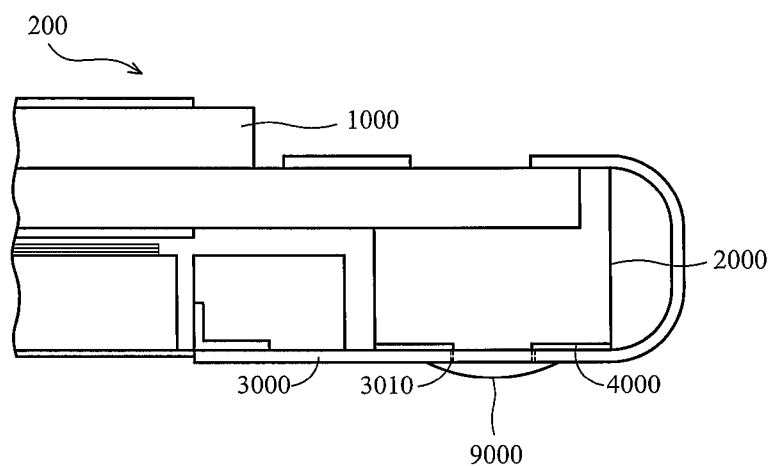
FIG. 3 is a schematic view showing an embodiment of a flexible circuit board fixed on a liquid crystal display.

The liquid crystal display module 200 processed by the method above is shown in FIG. 3, wherein the frame 2000 supports a TFT panel 1000. By this method, the locating reliability of the flexible circuit board 3000 is potentially increased.

Figure 1:
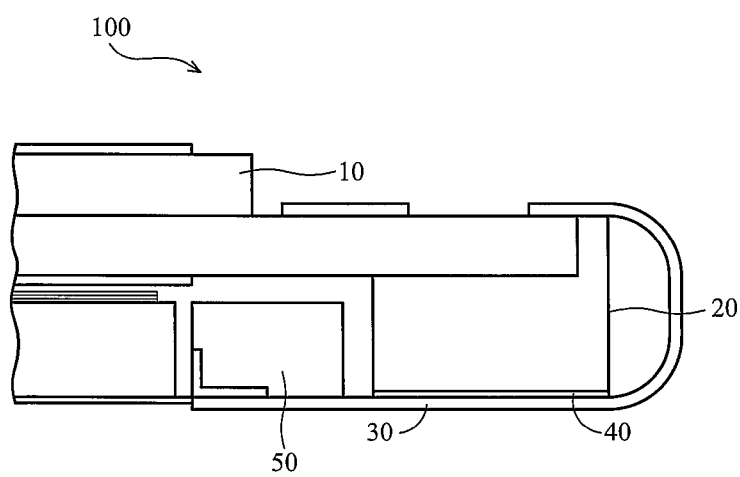
FIG. 1 is a schematic view of a conventional liquid crystal display module.
Figure 4A:
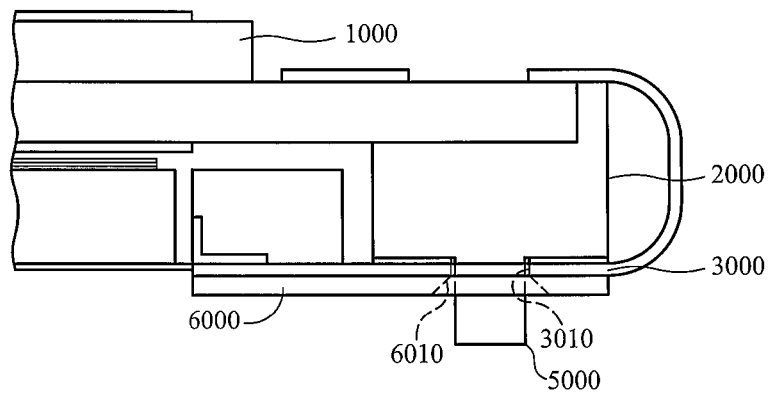
FIG. 4a is a schematic view of another embodiment of a liquid crystal display.

Referring to FIGS. 4a and 4a-1, another embodiment will be described specifically, a reinforcing sheet 6000 is disposed on a flexible circuit board 3000. The reinforcing sheet 6000 has a through hole 6010 corresponding to the locating hole 3010. When the flexible circuit board 3000 is bonded to the frame 2000, the locating element 5000 passes through the locating hole 3010 and the through hole 6010 as shown in FIG. 4a. The locating element 5000 is heated and pressed to form a deformed head 9000' which is even with the reinforcing sheet 6000 as shown in FIG. 4a-1. This is because the through hole 6010 receives the deformed locating element 5000.

Figure 4B:
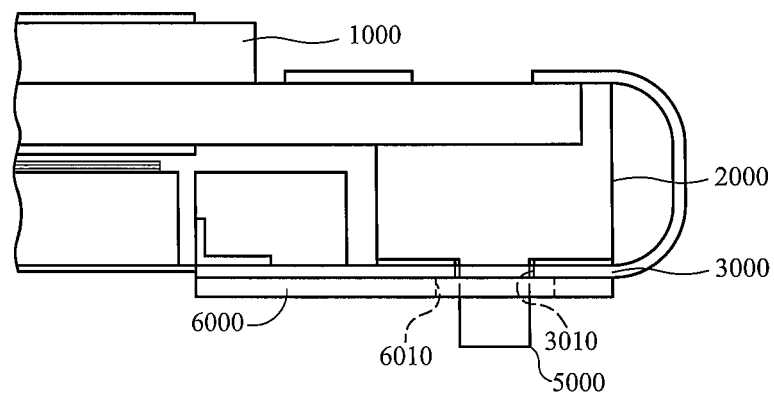
FIG. 4b is a schematic view of another embodiment of a liquid crystal display.
Figures 1, 4A:
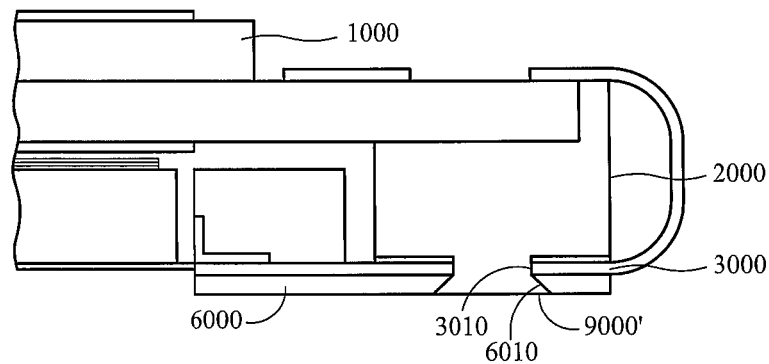
Figures 1, 4B:
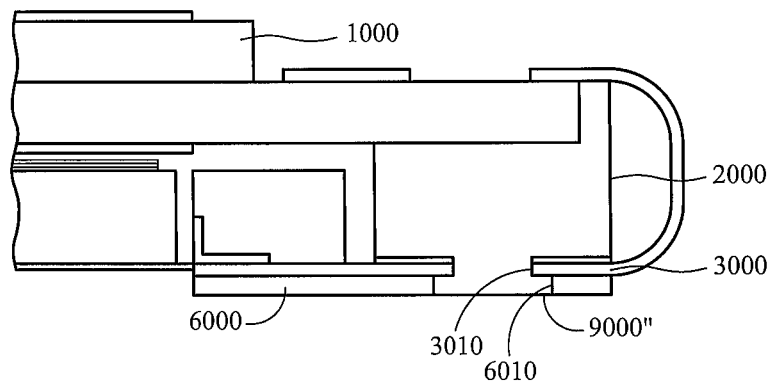

Note that, in other embodiments, through holes 6010 other than those previously disclosed can be used. By way of example, a through hole can be used that provides a space to receive a corresponding locating element. An exemplary embodiment is shown in FIG. 4a, wherein the through hole 6010 is tapered. Another embodiment is shown in FIGS. 4b and 4b-1, wherein the through hole 6010 is larger than the locating hole 3010. Because the reinforcing sheet 6000 has a sufficient thickness, the flat heat 9000" formed by heating and pressing the locating element 5000 can be accommodated between the wall of the through hole 6010 and the surface of the flexible circuit board 3000.

In some embodiments, a liquid crystal display utilizes the deformed head formed by heating and pressing the plastic locating element to fix the flexible circuit board on the frame, thereby the location reliability is increased. Furthermore, in some embodiments, a shorter assembly time is needed and a better bonding ability is provided typically achieved by the conventional methods.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fixing a flexible circuit board in a display module having a frame, comprising the following steps:
   providing a flexible circuit board having a locating hole;
   providing a reinforcing sheet on the flexible circuit board, the reinforcing sheet having a through hole corresponding to the locating hole;
   providing a locating element disposed on the frame corresponding to the locating hole;
   passing the locating element through the locating hole;
   bonding the flexible circuit board onto the frame; and
   deforming the locating element to fix the flexible circuit board on the frame.

2. The method as claimed in claim 1 further comprising a step: providing a thermopress device to deform the locating element by heating and pressing.

3. The method as claimed in claim 2, wherein the locating element is a column protruding from the frame prior to the heating and pressing.

4. The method as claimed in claim 3, wherein the locating element is deformed to be a deformed portion having a diameter larger than the through hole after the heating and pressing, thereby fixing the flexible circuit board on the frame.

5. The method as claimed in claim 2, wherein the locating element is made of plastic.

6. The method as claimed in claim 1, wherein the through hole is larger than the locating hole.

7. The method as claimed in claim 6, wherein the through hole is tapered.

* * * * *